United States Patent
Wang (10) Patent No.: US 12,030,091 B2
(45) Date of Patent: Jul. 9, 2024

(54) CLEANING SYSTEM FOR SEMICONDUCTOR STORAGE SHELF

(71) Applicant: CHANGXIN MEMORY TECHNOLOGIES, INC., Hefei (CN)

(72) Inventor: Yimo Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 474 days.

(21) Appl. No.: 17/389,526

(22) Filed: Jul. 30, 2021

(65) Prior Publication Data

US 2022/0032347 A1 Feb. 3, 2022

Related U.S. Application Data

(63) Continuation of application No. PCT/CN2021/096934, filed on May 28, 2021.

(30) Foreign Application Priority Data

Jul. 30, 2020 (CN) .......................... 202010749249.8

(51) Int. Cl.
| | |
|---|---|
| B08B 13/00 | (2006.01) |
| B08B 1/12 | (2024.01) |
| B08B 1/30 | (2024.01) |
| B08B 1/32 | (2024.01) |
| B08B 5/04 | (2006.01) |
| H01L 21/67 | (2006.01) |

(52) U.S. Cl.
CPC ................ *B08B 13/00* (2013.01); *B08B 1/12* (2024.01); *B08B 1/30* (2024.01); *B08B 1/32* (2024.01); *B08B 5/04* (2013.01); *H01L 21/67046* (2013.01)

(58) Field of Classification Search
CPC .. B08B 13/00; B08B 1/12; B08B 1/30; B08B 1/32; B08B 5/04; H01L 21/67016; H01L 21/67017; H01L 21/67769; A46B 13/02
USPC ........................................................... 15/319
See application file for complete search history.

(56) References Cited

U.S. PATENT DOCUMENTS 5,769,954 A    6/1998  Wanner

FOREIGN PATENT DOCUMENTS

| CN | 104603032 A |   | 5/2015 | |
|---|---|---|---|---|
| CN | 204950814 U |   | 1/2016 | |
| CN | 105427223 A | * | 3/2016 | ......... G06K 17/0032 |
| CN | 105821551 A |   | 8/2016 | |
| CN | 205904188 U |   | 1/2017 | |

(Continued)

OTHER PUBLICATIONS

English translation of CN 108393281A (Year: 2018).*

(Continued)

*Primary Examiner* — Laura C Guidotti
*Assistant Examiner* — Sukwoo James Chang
(74) *Attorney, Agent, or Firm* — Syncoda LLC; Feng Ma (57) ABSTRACT

A cleanup system for the semiconductor storage shelf is provided. A semiconductor storage shelf is provided with a plurality of stalls. The cleanup system for the semiconductor storage shelf includes a conveying device and a cleanup device. The cleanup device is configured to clean up each stall of the semiconductor storage shelf. The cleanup device is detachably connected to the conveying device. The conveying device is configured to convey the cleanup device to each stall of the semiconductor storage shelf.

14 Claims, 12 Drawing Sheets

(56) References Cited

FOREIGN PATENT DOCUMENTS

| CN | 206296271 U | | 7/2017 | |
|----|-------------|---|--------|---|
| CN | 206854321 U | | 1/2018 | |
| CN | 108393281 A | | 8/2018 | |
| CN | 110292258 A | | 10/2019 | |
| CN | 209565349 U | | 11/2019 | |
| CN | 210207981 U | | 3/2020 | |
| CN | 111014214 A | | 4/2020 | |
| CN | 210849931 U | * | 6/2020 | ............ B25B 11/00 |
| CN | 111392309 A | | 7/2020 | |
| WO | 2018142389 A1 | | 8/2018 | |
| WO | WO2019217229 A1 | * | 11/2019 | ............ F21V 29/767 |

OTHER PUBLICATIONS

English translation of CN 111392309A (Year: 2020).*
English translation of CN 105821551A (Year: 2016).*
English translation of WO2019217229A1 (Year: 2019).*
English translation of CN 210207981U (Year: 2020).*
English translation of CN 205904188U (Year: 2017).*
English translation of CN105427223A (Year: 2016).*
English translation of CN 210849931U (Year: 2020).*
International Search Report in the international application No. PCT/CN2021/096934, mailed on Jul. 27, 2021.
First Office Action of the Chinese application No. 202010749249.8, issued on Jul. 26, 2022.

* cited by examiner

CLEANING SYSTEM FOR SEMICONDUCTOR STORAGE SHELF

CROSS-REFERENCE TO RELATED APPLICATIONS

This is a continuation application of International Patent Application No. PCT/CN2021/096934 filed on May 28, 2021, which claims priority to Chinese Patent Application No. 202010749249.8 filed on Jul. 30, 2020. The disclosures of these applications are hereby incorporated by reference in their entirety.

BACKGROUND

In the related art, a semiconductor storage shelf may be configured to store semiconductor wafer boxes. After the semiconductor storage shelf is used for a long time, the conveying efficiency is affected as errors are likely to be reported due to pollution. For example, when an internal environment of the semiconductor storage shelf is poor, a wafer box which is placed in the storage shelf may be affected, and the product yield may be affected. Each stall of the semiconductor storage shelf is provided with a reflector plate for preventing the wafer box from being placed for the second time. If the reflector plate is stained, insufficient reflection may be caused, so that judgment of a sensor for sensing repeated placement in the semiconductor storage shelf may be affected, the error reporting rate of the storage shelf may be increased, and the normal operation of the storage shelf may be affected. Therefore, the semiconductor storage shelf needs to be cleaned. The current cleaning method for the storage shelf adopts manual cleaning. The semiconductor storage shelf generally has a height of 4-5 m (meters). A plurality of cleaning personnel are needed to carry out the cleaning in cooperation. However, manual cleaning is not only low in efficiency but also prone to safety hazards.

SUMMARY

The present disclosure relates to the technical field of semiconductors, and in particular to a cleanup system for a semiconductor storage shelf.

The present disclosure provides a cleanup system for a semiconductor storage shelf, which can automatically clean a semiconductor storage shelf without manual cleaning, thereby improving the cleaning efficiency and minimizing the safety hazards of manual cleaning.

In the cleanup system for the semiconductor storage shelf according to embodiments of the present disclosure, a semiconductor storage shelf may be provided with a plurality of stalls. The cleanup system for the semiconductor storage shelf may include a conveying device and a cleanup device. The cleanup device may be configured to clean up each stall of the semiconductor storage shelf. The cleanup device may be detachably connected to the conveying device. The conveying device may be configured to convey the cleanup device to each stall of the semiconductor storage shelf.

REFERENCE NUMERALS

100: cleanup system for the semiconductor storage shelf;
1: conveying device, 11: conveying arm, 12: carrying platform, 13: first positioning portion;
2: cleanup device, 20: cleaning device, 21: first cleaning portion, 22: second cleaning portion;
221: cleaning brush, 23: driving device, 231: first cleaning motor, 232: second cleaning motor, 24: dust suction device, 25: first fixing portion, 26: second fixing portion, 27: switching device, 291: first gear transmission assembly, 292: first bevel gear, 293: second bevel gear, 294: third bevel gear, 201: casing;
295: second gear transmission assembly, 296: cylindrical gear;
3: travel track;
4: moving device, 41: moving motor, 42: threaded spindle assembly, 43: threaded spindle, 44: threaded spindle sliding block, 45: limiting bearing;
5: stall, 51: reflector plate, 52: base plate, 53: second positioning portion;
200: semiconductor storage shelf.

DETAILED DESCRIPTION

A cleanup system for the semiconductor storage shelf as set forth in the present disclosure is described in further detail below with reference to the drawings and detailed description.

Figure 1:
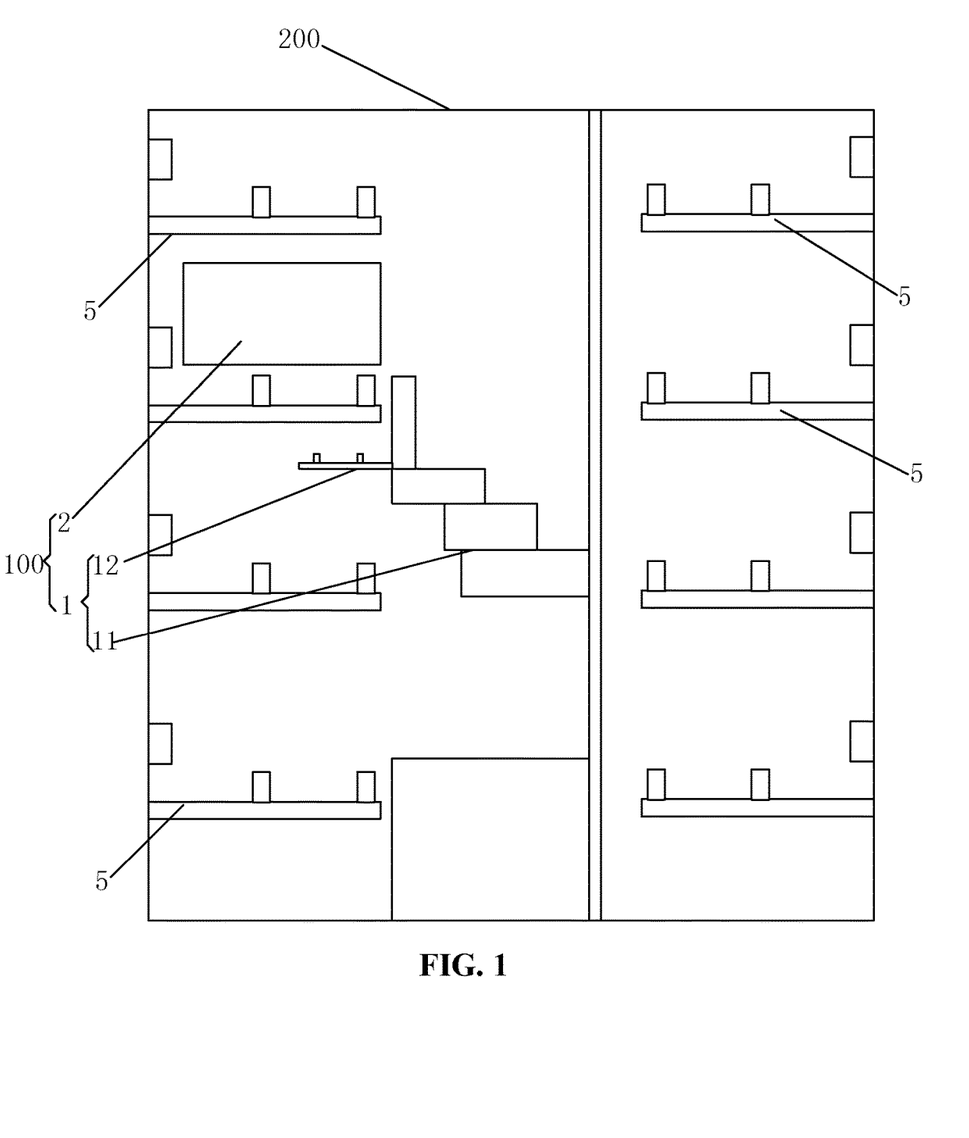
FIG. 1 is a schematic view of a cleanup system for the semiconductor storage shelf and a semiconductor storage shelf according to an embodiment of the present disclosure.

A cleanup system for the semiconductor storage shelf 100 according to an embodiment of the present disclosure is described below with reference to the drawings. A semiconductor storage shelf 200 is configured to place and store semiconductor wafer boxes. As shown in FIG. 1, the semiconductor storage shelf 200 is provided with a plurality of stalls 5. The stalls 5 are spaced apart from each other. Each stall 5 is adapted to place a semiconductor wafer box.

As shown in FIG. 1, the cleanup system for the semiconductor storage shelf 100 according to an embodiment of the present disclosure may include a conveying device 1 and a cleanup device 2. The cleanup device 2 is configured to clean up the stalls 5 of the semiconductor storage shelf 200. The cleanup device 2 is detachably connected to the conveying device 1. The conveying device 1 is configured to convey the cleanup device 2 to the plurality of stalls 5 of the semiconductor storage shelf.

Therefore, in the cleanup system for the semiconductor storage shelf 100 according to the embodiment of the present disclosure, when the semiconductor storage shelf 200 needs to be cleaned, the cleanup device 2 may be conveyed, through the conveying device 1, to the stall 5 of the semiconductor storage shelf 200 which needs to be cleaned, and then the cleanup device 2 is separated from the conveying device 1. The stall 5 of the semiconductor storage shelf 200 may be cleaned up through the cleanup device 2, so that on-site manual cleanup is not needed, the cleanup efficiency can be improved, and the safety hazards of manual climbing operation can be avoided.

In some embodiments of the present disclosure, the conveying device 1 includes a conveying arm 11. A grabbing device may be arranged at a tail end of the conveying arm 11. The cleanup device 2 may be grabbed by the grabbing device and then be placed on the stall 5. One of the cleanup device 2 and the stall 5 is provided with a positioning portion, and the other one of the cleanup device 2 and the stall 5 is provided with a counterpart portion. After the conveying arm 11 grabs the cleanup device 2 and places the cleanup device onto the stall, the positioning portion cooperates with the counterpart portion to realize a positioning and a detachable connection of the stall 5 and the cleanup device 2. After the cleanup is finished, the grabbing device grabs the cleanup device 2 away, and the positioning portion is separated from the counterpart portion. The positioning portion and the counterpart portion may be in the form of a groove-protrusion cooperation structure so as to facilitate connection and separation of the cleanup device 2 and the stall 5.

Figure 3:
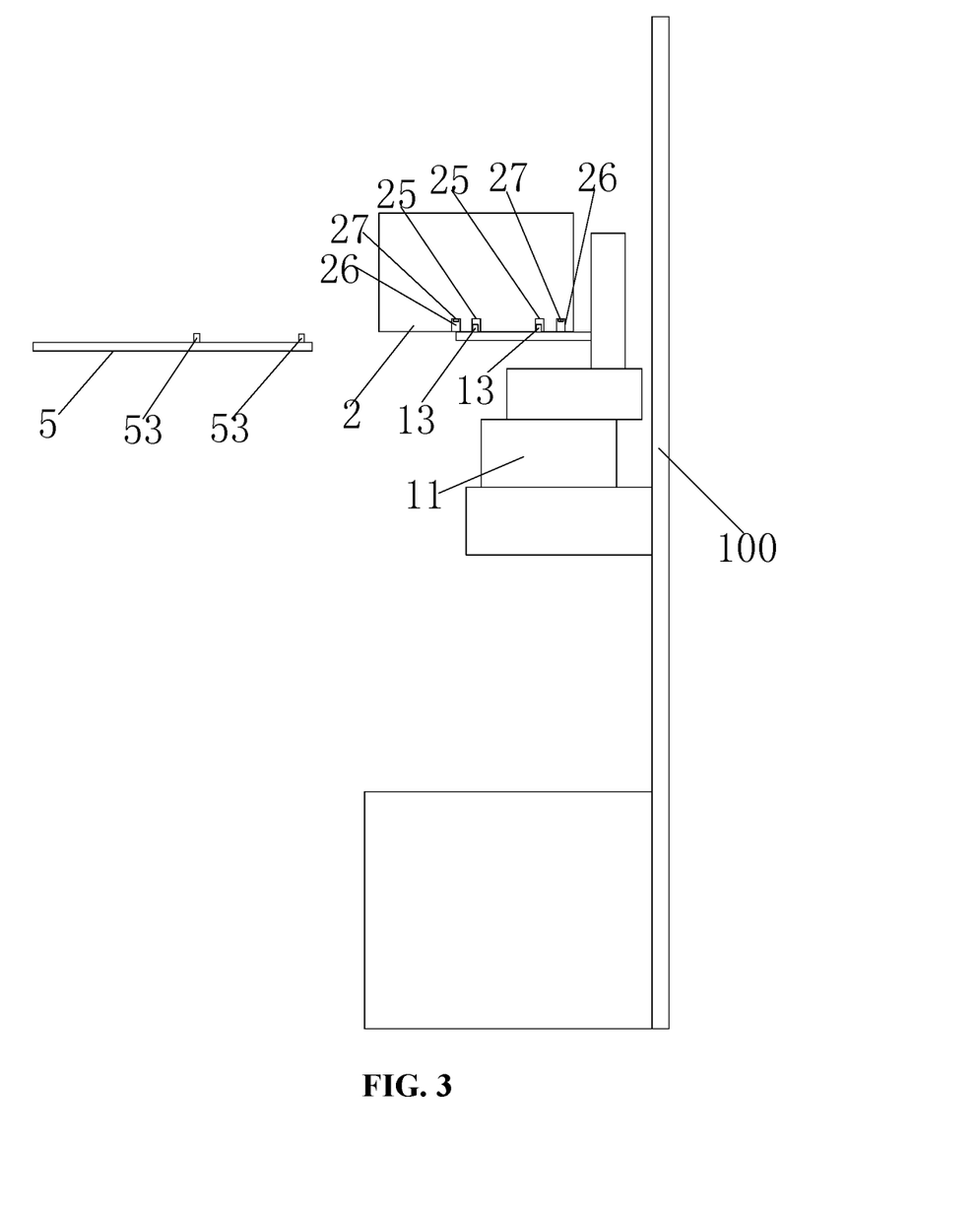
FIG. 3 is a first schematic view of a cleanup system for the semiconductor storage shelf and a conveying/cleanup device of a stall of a semiconductor storage shelf according to an embodiment of the present disclosure.
Figure 5:
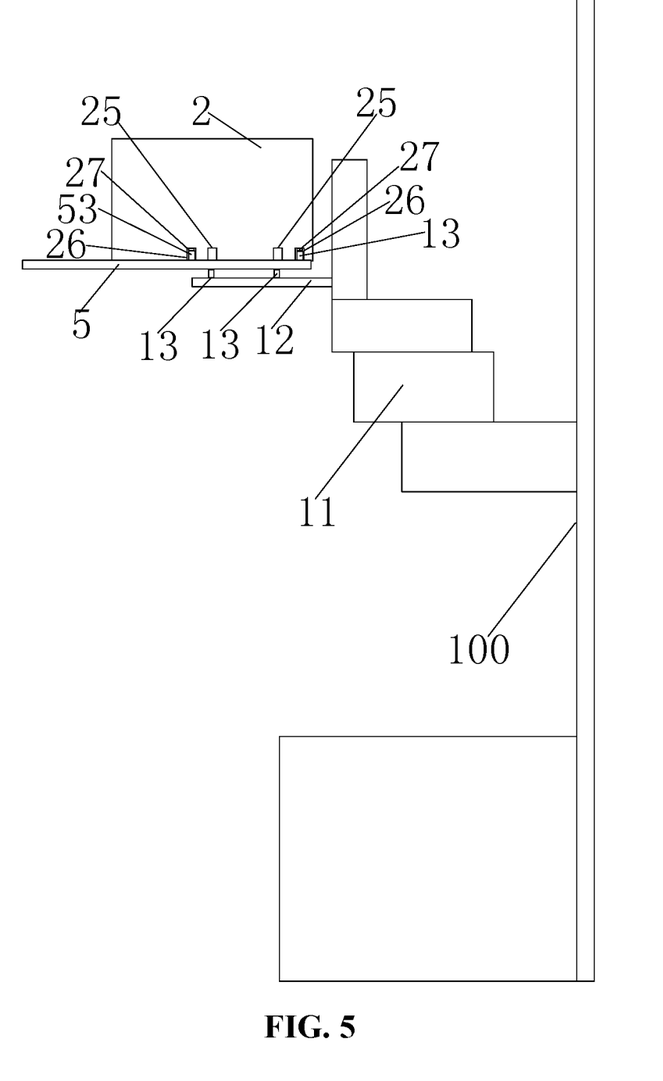
FIG. 5 is a third schematic view of a cleanup system for the semiconductor storage shelf and a conveying/cleanup device of a stall of a semiconductor storage shelf according to an embodiment of the present disclosure.

In some other embodiments of the present disclosure, referring to FIGS. 1, 3, and 5, the conveying device 1 may include a conveying arm 11. A carrying platform 12 for carrying the cleanup device 2 is arranged at a tail end of the conveying arm 11. The carrying platform 12 is detachably connected to the cleanup device 2. Therefore, when the semiconductor storage shelf 200 does not need to be cleaned up, the cleanup device 2 is placed on the carrying platform 12. When the semiconductor storage shelf 200 needs to be cleaned up, the cleanup device 2 may be conveyed to the stall 5 to be cleaned through the conveying arm 11. The cleanup device 2 is separated from the carrying platform 12 to clean the stall 5. The conveying device 1 may be configured to periodically clean up the storage shelf 200 to achieve an automatic cleanup function of the cleanup system for the semiconductor storage shelf 100. For example, the conveying device 1 will automatically convey the cleanup device 2 to the stall 5 for cleanup at predetermined time intervals.

In some embodiments of the present disclosure, the conveying arm 11 is movable in a vertical direction so that the conveying position can be adjusted by the movement of the conveying arm 11 in the vertical direction to convey the cleanup device 2 to the stalls 5 of the semiconductor storage shelf 200 at different heights. In some embodiments, the conveying arm 11 may extend in a horizontal direction whereby a horizontal conveying distance of the conveying arm 11 may be adjusted in the horizontal direction to convey the cleanup device 2 to the stall 5 at different horizontal positions of different heights.

Figure 4:
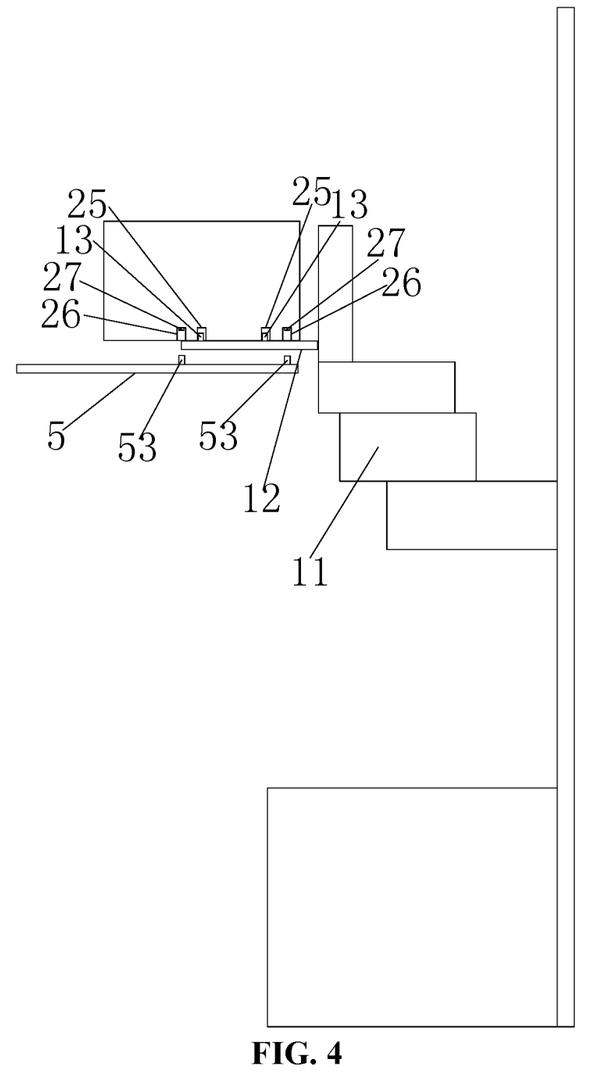
FIG. 4 is a second schematic view of a cleanup system for the semiconductor storage shelf and a conveying/cleanup device of a stall of a semiconductor storage shelf according to an embodiment of the present disclosure.
Figure 6:
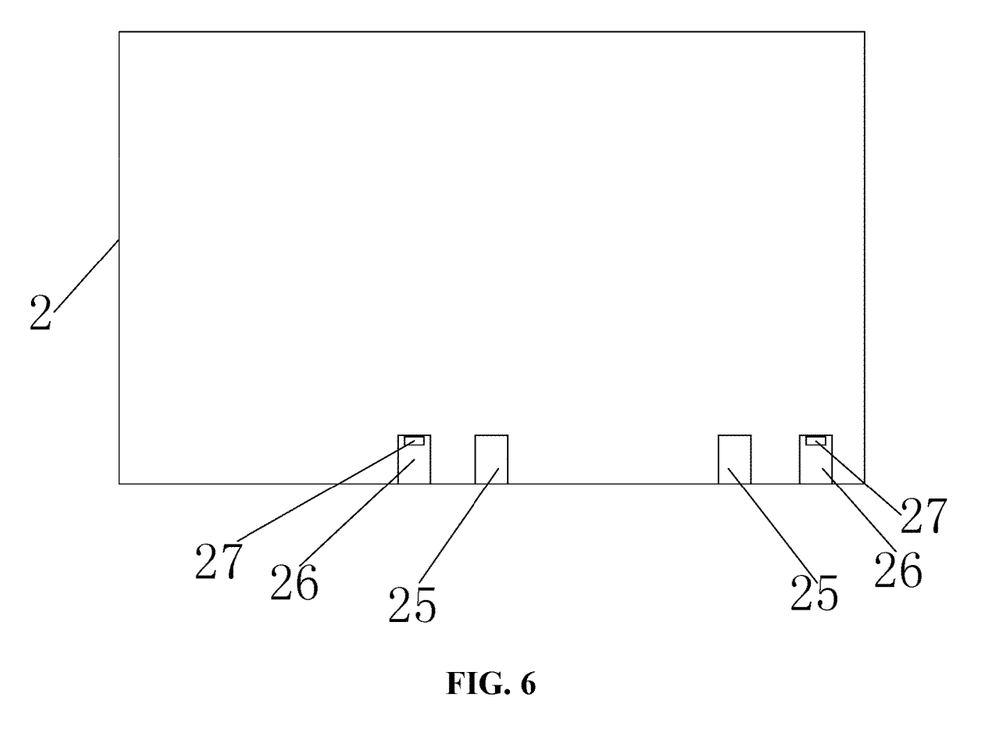
FIG. 6 is a schematic view of a cleanup device of a cleanup system for the semiconductor storage shelf according to an embodiment of the present disclosure.
Figure 7:
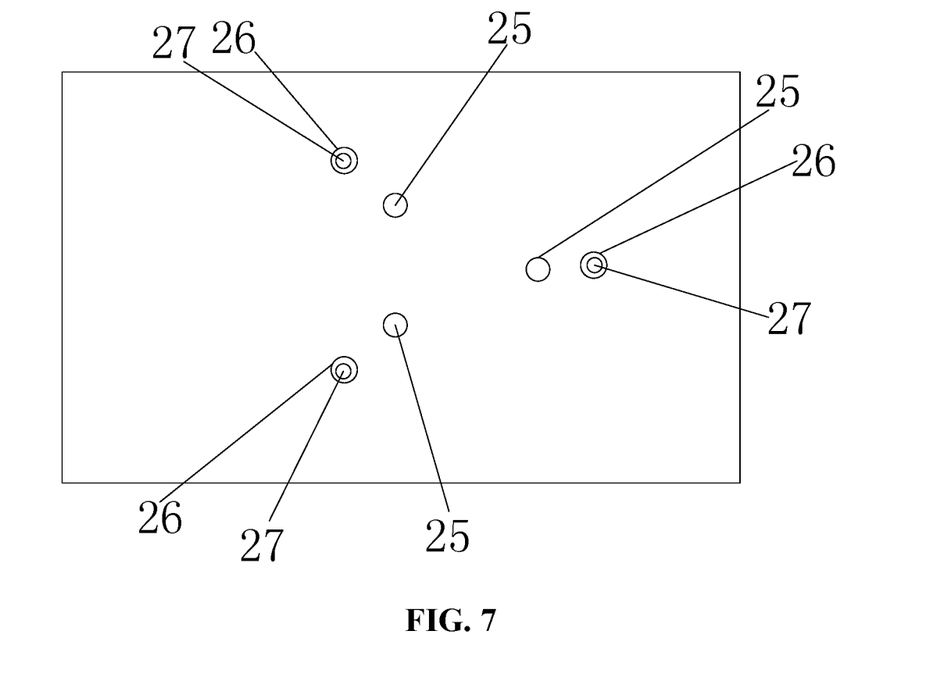
FIG. 7 is a bottom view of a cleanup device of a cleanup system for the semiconductor storage shelf according to an embodiment of the present disclosure.

In some embodiments of the present disclosure, as shown in FIGS. 3 to 5, the carrying platform 12 is provided with a first positioning portion 13. The cleanup device 2 is provided with a first fixing portion 25 cooperating with the first positioning portion 13. The first positioning portion 13 and the first fixing portion 25 are detachably connected to one another. The first positioning portion 13 cooperates with the first fixing portion 25 to achieve the positioning and the connection of the cleanup device 2 and the carrying platform 12 when the cleanup device 2 is located on the carrying platform 12. The first positioning portion 13 is separated from the first fixing portion 25 when the cleanup device 2 is conveyed to the semiconductor storage shelf 200. In one possible embodiment, as shown in FIGS. 3 to 5, the first positioning portion 13 is in the form of a protrusion protruding upwardly, and the first fixing portion 25 is in the form of a groove cooperating with the first positioning portion 13. The positioning and connection of the cleanup device 2 and the carrying platform 12 is achieved by the cooperation of the groove and the protrusion. There may be a plurality of first positioning portions 13 and a plurality of first fixing portions 25. The plurality of first positioning portions 13 are spaced apart from each other. For example, there may be two, three, or four first fixing portions 25, etc. In one possible embodiment, as shown in FIGS. 6 and 7, there may be three first fixing portions 25 distributed triangularly, and the first positioning portions 13 are arranged in a manner in correspondence with the first fixing portions 25, so that the positioning effect can be improved.

Of course, it will be understood that the first positioning portion 13 and the first fixing portion 25 may be, but are not limited to, the above-mentioned groove-protrusion cooperation structure. For example, the first positioning portion 13 and the first fixing portion 25 may form a clamping structure. The first positioning portion 13 may form a clamping jaw or a claw. The first fixing portion 25 may form a clamped portion to be grabbed by the claw or the clamping jaw. Therefore, the carrying platform 12 may grab and place the cleanup device 2 onto the stall 5 by the cooperation of the first positioning portion 13 and the first fixing portion 25.

As shown in conjunction with FIGS. 3 to 7, the cleanup device 2 is further provided with a second fixing portion 26. The stall 5 is provided with a second positioning portion 53 cooperating with the second fixing portion 26. When the cleanup device 2 is located on the stall 5, the second fixing portion 26 cooperates with the second positioning portion 53 to position the second fixing portion. Thus, the connection and positioning of the cleanup device 2 and the stall 5 can be realized through the cooperation of the second fixing portion 26 and the second positioning portion 53. Meanwhile, the conveying device 1 may be separated from the cleanup device 2.

In some embodiments of the present disclosure, the cleanup device 2 is provided with a switching device 27. The switching device 27 is configured to trigger a periodical start of the cleanup device 2 after the cleanup device 2 is placed on the stall 5 to clean up the stall periodically. That is, the switching device 27 may be configured to control the cleanup operation of the cleanup device 2. When the cleanup device 2 is placed on the stall 5, the switching device 27 is triggered to begin operating the cleanup device 2 over a period of time. For example, the cleanup device 2 begins cleaning up the stall 5 after the switching device 27 has triggered for 3 seconds. Therefore, the stall 5 can be automatically cleaned without manual control, the cleanup device 2 is periodically started to operate after the cleanup device 2 is positioned on the stall 5, and cleaning time can be shortened. In some alternative embodiments, the switching device 27 may be a pressure sensor which is triggered when a pressure of the cleanup device is sensed after the cleanup device 2 is placed in the stall 5. The cleanup device 2 begins cleaning up the stall 5 after a certain time (e.g. a few seconds).

In some embodiments, as shown in FIGS. 3 to 7, the switching device 27 may be configured to be triggered when the second positioning portion 53 cooperates with the second fixing portion 26. In one example, the second fixing portion 26 is in the form of a groove, the switching device 27 is arranged in the second fixing portion 26, and the switching device 27 is triggered when the second positioning portion 53 cooperates with the second fixing portion 26. As shown in FIGS. 2 and 3-6, the second positioning portion 53 may be in the form of a protrusion cooperating with the second fixing portion 26, the switching device 27 is arranged in the groove. When the second positioning portion 53 cooperates with the second fixing portion 26, the cleanup device 2 is supported on the stall 5, and the second positioning portion 53 is in contact with the switching device 27 so that the pressure sensor senses the pressure of the second positioning portion, thereby triggering the switching device 27 to start the cleanup device 2 for operation.

In the example shown in FIG. 5, the pressure sensor is arranged at the top of the second fixing portion 26, the second positioning portion 53 is in the form of a convex column. When the cleanup device 2 is placed on the stall 5, the second positioning portion 53 extends into the second fixing portion 26, an upper end of the second positioning portion 53 directly abuts against the pressure sensor, and the pressure sensor is triggered so that the cleanup device 2 begins automatically cleaning up the stall 5.

In the embodiments of the present disclosure, there may be a plurality of second fixing portions 26. The plurality of second fixing portions 26 are spaced apart from each other to improve the positioning effect of the cleanup device 2 and the stall 5. There may be at least one switching device 27, i.e. there may be one or more switching devices 27, and the switching device 27 may be arranged in at least one second fixing portion 26. As shown in FIG. 7, there may be three second fixing portions 26 arranged triangularly. A pressure sensor is arranged in each second fixing portion 26. When the three pressure sensors are triggered at the same time, the cleanup device 2 begins cleaning up after a few seconds, e.g. 3 seconds. Therefore, the cleanup device 2 is started to operate after the plurality of second positioning portions 53 cooperate with the plurality of second fixing portions 26. The cleanup device 2 is prevented from being started for cleaning up in the case where the cleanup device 2 is not stably connected to the stall 5, and the potential safety hazard caused by instability of the cleanup device 2 during cleanup is avoided.

In some embodiments, the plurality of first fixing portions 25 are distributed triangularly, and the plurality of second fixing portions 26 are distributed triangularly. The triangle formed by the plurality of first fixing portions 25 is located within the triangle formed by the plurality of second fixing portions 26. Notches are formed in the stall 5, and the positions of the plurality of first fixing portions 25 correspond to the positions of the notches. Therefore, after the plurality of second fixing portions 26 are positioned and fixed on the stall 5, the conveying device 1 can be separated from the plurality of first fixing portions 25 conveniently.

Figure 12:
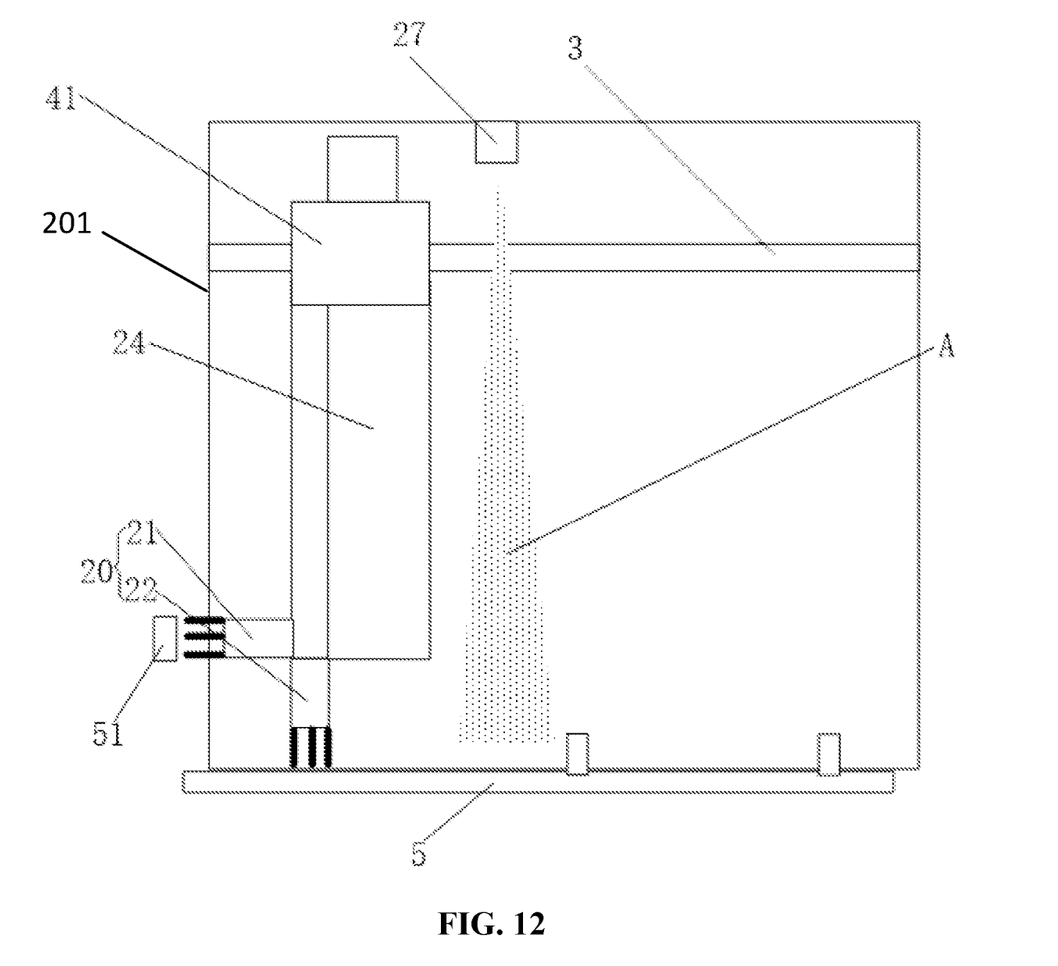
FIG. 12 is a schematic view of a cleanup device and a stall of a cleanup system for the semiconductor storage shelf according to another embodiment of the present disclosure from another perspective.

In some other embodiments of the present disclosure, as shown in FIG. 12, the switching device 27 may be an object sensing device. For example, the switching device 27 may be a photosensitive sensor. An illumination range of the photosensitive sensor is shown by "A" in FIG. 12. The photosensitive sensor is configured to be triggered when the stall 5 can be detected after the cleanup device 2 is placed on the stall 5. In some embodiments, when the cleanup device 2 is not placed on the stall 5, the stall 5 cannot be irradiated by the photosensitive sensor, so that the photosensitive sensor cannot be triggered since the stall 5 cannot be detected. When the conveying device 1 conveys the cleanup device 2 to the stall 5, the photosensitive sensor can be triggered when detecting the stall 5, so that the cleanup device 2 can be controlled to begin cleaning up periodically. In one possible embodiment, the photosensitive sensor may be configured to detect the base plate 52 of the stall 5.

In some embodiments of the present disclosure, the cleanup device 2 may include a cleaning device 20 and a moving device 4. The moving device 4 is connected to the cleaning device 20 to drive the cleaning device 20 to move. The cleaning device 20 may be configured to clean the stall 5. The moving device 4 may be configured to drive the cleaning device 20 to move, so that the cleaning device 20 can thoroughly clean the stall 5, and the cleaning area and the cleaning effect for the stall 5 are increased. In some embodiments, the cleanup device 2 may be provided with a power device connected to the cleaning device 20 and the moving device 4 to provide a power source for the cleaning device 20 and the moving device 4.

Figure 2:
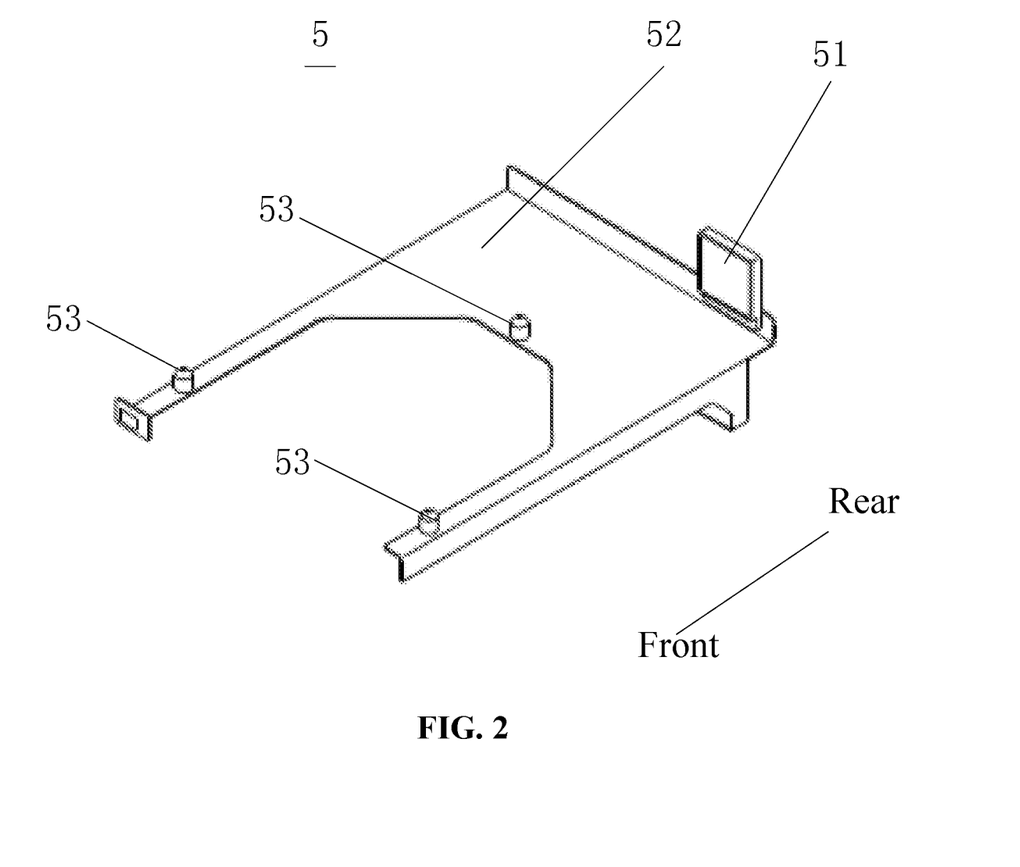
FIG. 2 is a schematic view of a stall of a semiconductor storage shelf.
Figure 9:
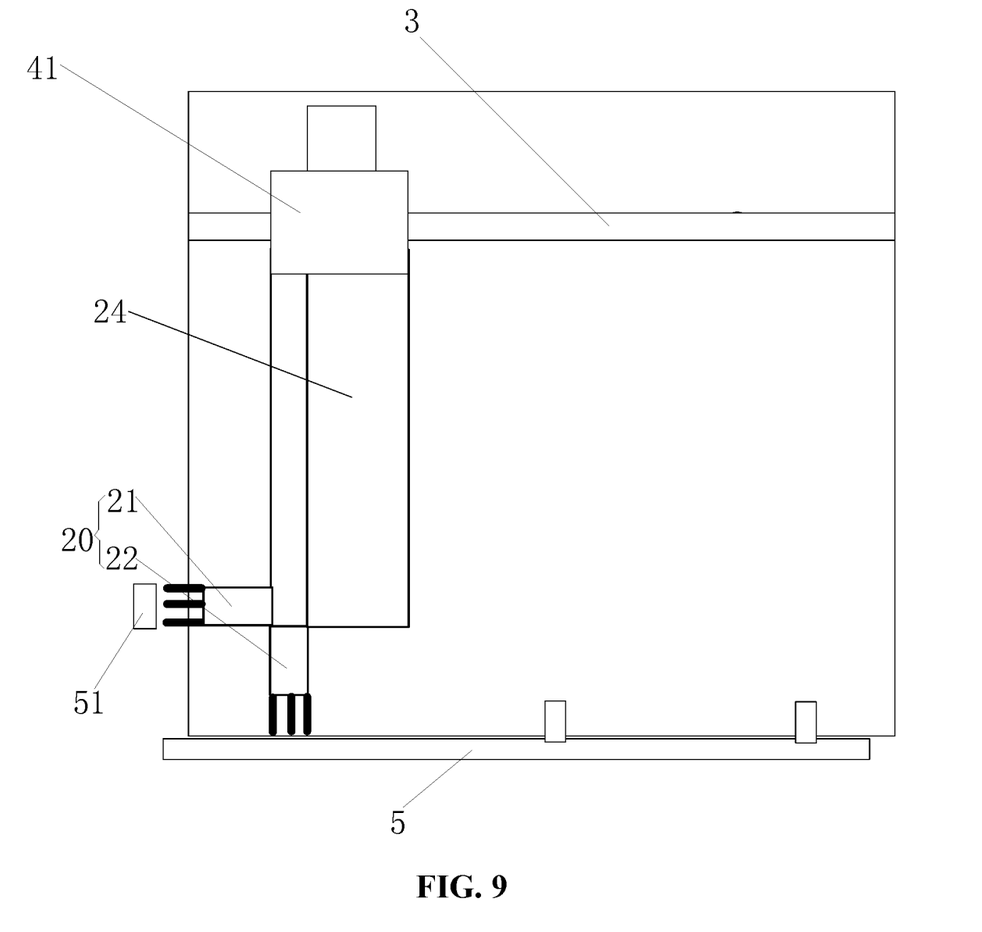
FIG. 9 is a schematic view of a cleanup device and a stall of a cleanup system for the semiconductor storage shelf according to one embodiment of the present disclosure from another perspective.
Figure 11:
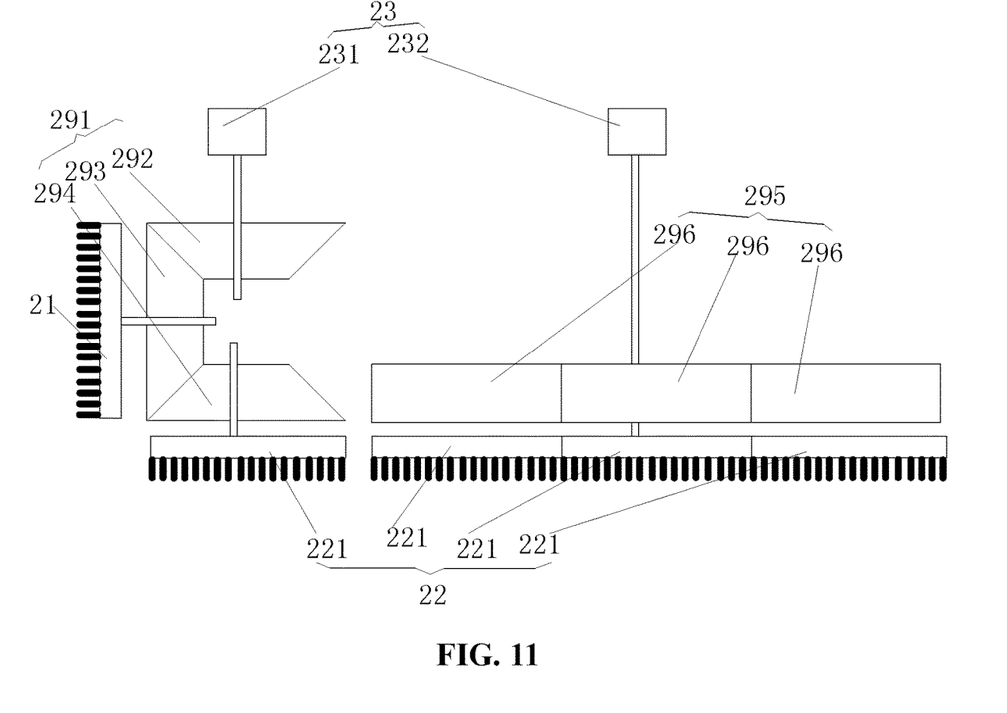
FIG. 11 is a schematic view of a cleaning device of a cleanup device of a cleanup system for the semiconductor storage shelf according to an embodiment of the present disclosure.

As shown in FIG. 2, the stall 5 includes a base plate 52 and a reflector plate 51. As shown in FIGS. 9 and 11, the cleaning device 20 may include a first cleaning portion 21 for cleaning the reflector plate 51 and a second cleaning portion 22 for cleaning the base plate 52. In some embodiments, the reflector plate 51 is configured to prevent a wafer box from being placed onto the stall for the second time. If the reflector plate 51 is stained, it is easy to affect the judgment of a sensor for sensing the repeated placement of the wafer box onto the semiconductor storage shelf 200. The base plate 52 is configured to support the wafer box. If the surface of the base plate 52 is stained, it will affect the placed wafer box, and thus the yield of products is easily affected. Therefore, the surface of the base plate 52 and the reflector plate 51 need to be cleaned when the stall 5 is cleaned. The reflector plate 51 is arranged on a lateral portion of the base plate 52. The position of the first cleaning portion 21 corresponds to the position of the reflector plate 51, and the position of the second cleaning portion 22 corresponds to the position of the base plate 52. Therefore, the reflector plate 51 may be cleaned by the first cleaning portion 21, and the base plate 52 may be cleaned by the second cleaning portion 22, so that the stall 5 can be effectively cleaned up.

In some embodiments, the cleaning device 20 further includes a driving device 23 and a transmission device connected to the driving device 23. The transmission device is connected to the first cleaning portion 21 and the second cleaning portion 22. The driving device 23 drives the first cleaning portion 21 and the second cleaning portion 22 to rotate through the transmission device, so that the stall 5 can be cleaned by the first cleaning portion 21 and the second cleaning portion 22. As for the driving device 23 and the transmission device, the driving device 23 may be a motor, and the transmission device may be a gear transmission assembly. The motor drives the gear transmission assembly to operate to drive the first cleaning portion 21 and the second cleaning portion 22 to operate.

In some embodiments of the present disclosure, the driving device 23 may include a first cleaning motor 231 and a second cleaning motor 232. The transmission device includes a first gear transmission assembly 291 connected to the first cleaning motor 231 and a second gear transmission assembly 295 connected to the second cleaning motor 232. The second cleaning portion 22 includes a plurality of cleaning brushes 221. The first gear transmission assembly 291 is connected to the first cleaning portion 21 and at least one of the cleaning brushes 221. The second gear transmission assembly 295 is connected to the remaining cleaning brushes 221.

In some embodiments, the stall 5 of the semiconductor storage shelf 200 may include a base plate 52 and a reflector plate 51. The reflector plate 51 is arranged on a lateral portion of the base plate 52. The position of the first cleaning portion 21 corresponds to the position of the reflector plate 51, and the position of the second cleaning portion 22 corresponds to the position of the base plate 52. The first cleaning portion 21 is arranged on a lateral portion of the second cleaning portion 22. The second cleaning portion 22 includes a plurality of cleaning brushes 221. The plurality of cleaning brushes 221 are arranged in rows along a width direction of the base plate 52. In some embodiments, the cleaning range of the plurality of cleaning brushes 221 in the width direction of the base plate 52 can cover at least the surface width of the base plate 52, so that the stall 5 can be thoroughly cleaned in the width direction by the plurality of cleaning brushes 221.

The first cleaning motor 231 can drive the first gear transmission assembly 291 to drive the first cleaning portion 21 and the at least one cleaning brush 221 into rotation, and the second cleaning motor 232 can drive the second gear transmission assembly 295 to drive the other cleaning brushes 221 into rotation. Since the first cleaning portion 21 is arranged on the lateral portions of the plurality of cleaning brushes 221, the driving achieved by the arrangement of the two motors facilitates the power transmission between the driving device 23, the first cleaning portion 21 and the second cleaning portion 22. In addition, the first cleaning motor 231 can drive the first cleaning portion 21 to rotate and also drive a part of the cleaning brushes 221 of the second cleaning portion 22 to rotate. Therefore, each of the first cleaning motor 231 and the second cleaning motor 232 can drive multiple cleaning brushes to rotate, which facilitates the balancing of the number of the cleaning brushes driven by each cleaning motor.

The first gear transmission assembly 291 may be a bevel gear transmission assembly. The first cleaning portion 21 is arranged on the lateral portion of the cleaning brush 221. The bevel gear transmission assembly facilitates the connection between the first cleaning portion 21, the cleaning brush 221, and the first cleaning motor 231. The second gear transmission assembly 295 may be a cylindrical gear assembly through which the plurality of cleaning brushes 221 are connected to each other. In the example shown in FIG. 11, the first gear transmission assembly 291 may include a first bevel gear 292 connected to the first cleaning motor 231, a second bevel gear 293 connected to the first cleaning portion 21, and a third bevel gear 294 connected to the cleaning brush 221. The first bevel gear 292 and the third bevel gear 294 mesh with the second bevel gear 293 respectively. The second gear transmission assembly 295 may include a plurality of cylindrical gears 296. The plurality of cylindrical gears 296 are connected to the plurality of cleaning brushes 221, and the plurality of cylindrical gears 296 mesh sequentially with each other. The second cleaning motor 232 may be connected to one of the plurality of cylindrical gears 296 to drive the plurality of cylindrical gears 296 into rotation.

In other examples of the present disclosure, the driving device 23 may include a first cleaning motor 231 and a second cleaning motor 232. The first cleaning motor 231 may be configured to drive the first cleaning portion 21 into rotation, and the second cleaning motor 232 may be configured to drive the operation of the second cleaning portion 22. In some embodiments, the first cleaning portion 21 is arranged on the lateral portion of the second cleaning portion 22. Therefore, the first cleaning portion 21 is driven by the first cleaning motor 231 to operate, and the second cleaning portion 22 is driven by the second cleaning motor 232 to operate, so that the first cleaning portion 21 and the second cleaning portion 22 can be driven by different motors. This is favorable for driving the first cleaning portion 21 and the second cleaning portion 22 to operate in different directions. Moreover, the driving motor is relatively small due to the relatively small volume of the cleanup device 2. It is also possible to provide sufficient power output for the operation of the first cleaning portion 21 and the second cleaning portion 22 by using two driving motors. Moreover, the first cleaning motor 231 and the first cleaning portion 21 are connected by a transmission mechanism independent from a transmission mechanism connecting the second cleaning motor 232 with the second cleaning portion 22. The structure of a transmission device can be simplified compared with the case where one motor is used for driving both the first cleaning portion 21 and the second cleaning portion 22 to operate simultaneously.

Figure 8:
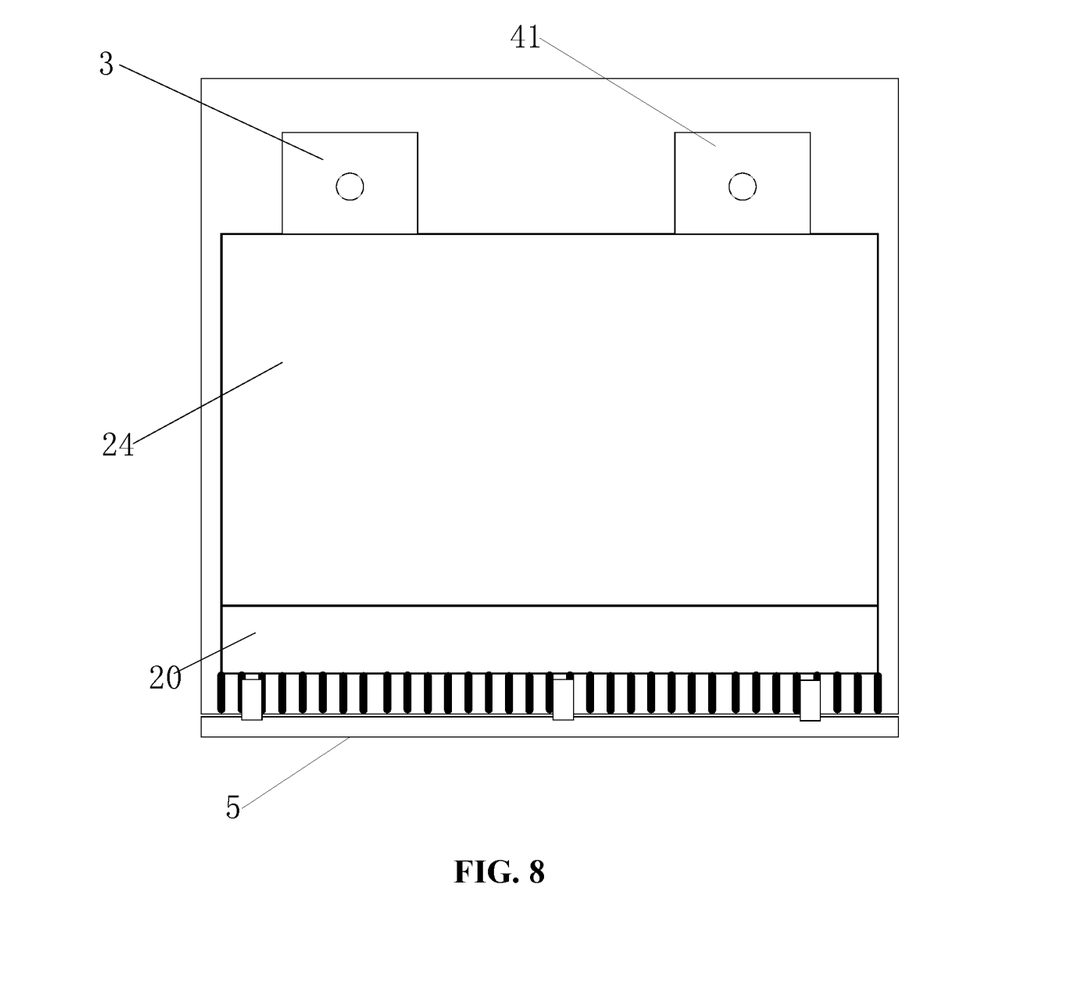
FIG. 8 is a schematic view of a cleanup device and a stall of a cleanup system for the semiconductor storage shelf according to one embodiment of the present disclosure from a perspective.

In some embodiments, as shown in FIGS. 8 and 9, the cleanup device 2 further includes a dust suction device 24 for cleaning off the stains. The dust suction device 24 is arranged on one side of the second cleaning portion 22. Therefore, dust raised during cleaning can be removed by the suction of the dust suction device 24 to improve the cleaning effect. The dust suction device 24 may be formed as a dust collector. For example, the dust suction device 24 may include a dust suction fan, a dust filtering bag, a dust suction channel, etc. The dust suction channel is provided with a dust suction opening. The dust suction opening is formed on a lower surface of the cleanup device 2. The dust suction fan operates in such a way that the dust suction opening draws air with dust, and the air circulates along the dust suction channel and flows out through an air outlet of the dust suction fan after being filtered by the dust filtering bag, thereby realizing dust suction and cleanup.

In some embodiments of the present disclosure, the cleanup device 2 further includes a travel track 3. The cleaning device 20 is arranged on the travel track 3. The moving device 4 drives the cleaning device 20 to move along the travel track 3. Therefore, the moving device 4 drives the cleaning device 20 to move along the travel track 3 so that the cleaning device 20 can thoroughly clean the stall 5. In one example, the travel track 3 may extend in a lengthwise direction of the stall 5. Therefore, the cleanup device 2 is movable in the lengthwise direction of the stall 5, so that the stall 5 can be thoroughly cleaned in the lengthwise direction.

Figure 10:
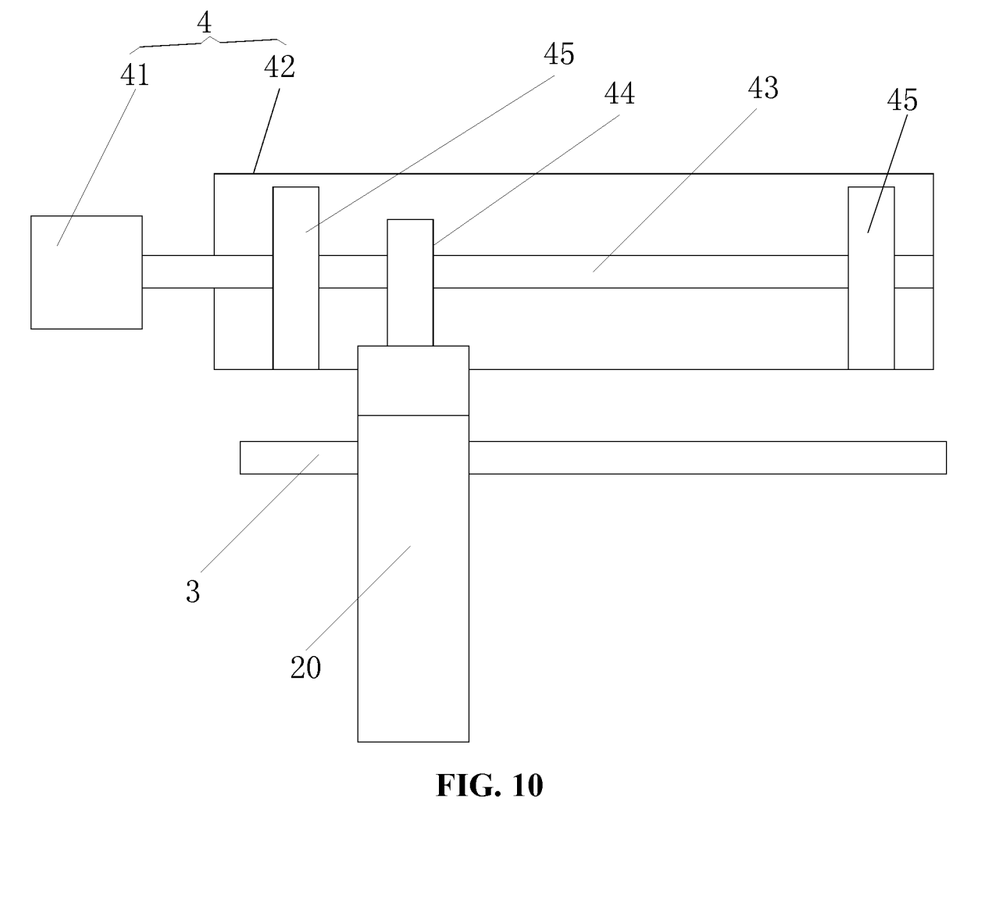
FIG. 10 is a schematic partial view of a moving device and a cleaning device of a cleanup device of a cleanup system for the semiconductor storage shelf according to one embodiment of the present disclosure.

In some embodiments, as shown in FIGS. 9 and 10, the moving device 4 may include a moving motor 41 and a threaded spindle assembly 42. The threaded spindle assembly 42 is connected to the moving motor 41 and the cleanup device 2. The threaded spindle assembly 42 may include a threaded spindle 43, a threaded spindle sliding block 44, and limiting bearings 45. The threaded spindle 43 is connected to the moving motor 41. The threaded spindle sliding block 44 is slidably arranged on the threaded spindle 43 and connected to the cleanup device 2. There are two limiting bearings 45 which are fixedly arranged at two ends of the threaded spindle 43 respectively. The threaded spindle sliding block 44 is arranged between the two limiting bearings 45 to limit a sliding distance of the threaded spindle sliding block 44. Therefore, the moving motor 41 drives the threaded spindle 43 to rotate to drive the threaded spindle sliding block 44 to slide along the threaded spindle 43. The sliding movement of the threaded spindle sliding block 44 drives the cleanup device 2 to move along the travel track, and a sliding distance of the threaded spindle sliding block 44 can be limited through the limiting bearings 45 to limit a moving distance of the cleanup device 2.

In some embodiments of the present disclosure, the cleanup device 2 further includes a casing 201. The bottom of the casing 201 is opened, and a side of the casing 201 facing towards the reflector plate 51 is at least partially opened. The cleaning device 20 and the moving device 4 are arranged in the casing 201. The cleaning device 20 includes a first cleaning portion 21 and a second cleaning portion 22. Therefore, the first cleaning portion 21 may protrude from the bottom to clean up the base plate 52 of the stall 5, and the second cleaning portion 22 may protrude from the side of the casing 201 to clean up the reflector plate 51. In one embodiment, both the bottom and side of the casing 201 may be completely opened, i.e. neither the bottom of the casing 201 nor the side of the casing 201 facing towards the reflector plate 51 is provided with baffles, to facilitate the cleanup of the stall 5. In some embodiments, the casing 201 of the cleanup device 2 may have substantially the same size and shape as a wafer box for holding wafers, or the casing 201 may be further modified based on the wafer box to accommodate the cleaning device 20 and the moving device 4. Therefore, the cleanup device 2 is conveniently placed on the stall 5, and the cleanup device 2 is also conveniently positioned on and connected with the stall 5.

The foregoing is merely a preferred embodiment of the present disclosure, it is to be noted that numerous modifications and embellishments may be devised by those of ordinary skill in the art without departing from the principle of the present disclosure, and such modifications and embellishments are also considered to be within the scope of protection of the present disclosure.

What is claimed is:

1. A cleaning system for a semiconductor storage shelf, the semiconductor storage shelf being provided with a plurality of stalls, the cleaning system for the semiconductor storage shelf comprising:
 a conveying device; and
 a cleanup device, configured to clean up each stall of the semiconductor storage shelf, wherein the cleanup device is detachably connected to the conveying device, and the conveying device is configured to convey the cleanup device to each stall of the semiconductor storage shelf;
 wherein the cleanup device comprises a cleaning device and a moving device connected to the cleaning device to drive the cleaning device to move;
 wherein the stall comprises a base plate and a reflector plate, and the cleaning device comprises a first cleaning portion for cleaning the reflector plate and a second cleaning portion for cleaning the base plate;
 wherein the cleaning device further comprises a driving device and a transmission device connected to the driving device, the transmission device is connected to the first cleaning portion and the second cleaning portion, and the driving device drives the first cleaning portion and the second cleaning portion to rotate through the transmission device;
 wherein the driving device comprises a first cleaning motor and a second cleaning motor, the transmission device comprises a first gear transmission assembly connected to the first cleaning motor and a second gear transmission assembly connected to the second cleaning motor, the second cleaning portion comprises a plurality of cleaning brushes, the first gear transmission assembly is connected to the first cleaning portion and at least one of the plurality of cleaning brushes, and the second gear transmission assembly is connected to the remaining plurality of cleaning brushes.

2. The cleaning system for the semiconductor storage shelf according to claim 1, wherein the conveying device comprises a conveying arm, a carrying platform for carrying the cleanup device is arranged at an end of the conveying arm, and the carrying platform is detachably connected to the cleanup device.

3. The cleaning system for the semiconductor storage shelf according to claim 2, wherein the carrying platform is provided with a first positioning portion, the cleanup device is provided with a first fixing portion cooperating with the first positioning portion, and the first positioning portion and the first fixing portion are detachably connected to one another.

4. The cleaning system for the semiconductor storage shelf according to claim 3, wherein the cleanup device is further provided with a second fixing portion, and the stall is provided with a second positioning portion cooperating with the second fixing portion.

5. The cleaning system for the semiconductor storage shelf according to claim 1, wherein the cleanup device is provided with a switching device, the switching device is configured to trigger a periodical start of the cleanup device after the cleanup device is conveyed to the stall, to clean up the stall.

6. The cleaning system for the semiconductor storage shelf according to claim 5, wherein the switching device is a pressure sensor.

7. The cleaning system for the semiconductor storage shelf according to claim 5, wherein the switching device is a photosensitive sensor.

8. The cleaning system for the semiconductor storage shelf according to claim 1, wherein the first gear transmission assembly is a bevel gear transmission assembly, and the second gear transmission assembly is a cylindrical gear transmission assembly.

9. The cleaning system for the semiconductor storage shelf according to claim 1, wherein the cleanup device further comprises a dust suction device for cleaning off stains, and the dust suction device is arranged on one side of the second cleaning portion.

10. The cleaning system for the semiconductor storage shelf according to claim 1, wherein the cleanup device further comprises a travel track, the cleaning device is arranged on the travel track, and the moving device drives the cleaning device to move along the travel track.

11. The cleaning system for the semiconductor storage shelf according to claim 10, wherein the travel track extends in a lengthwise direction of the stall.

12. The cleaning system for the semiconductor storage shelf according to claim 1, wherein the moving device comprises a moving motor and a threaded spindle assembly, and the threaded spindle assembly is connected to the moving motor and the cleanup device.

13. The cleaning system for the semiconductor storage shelf according to claim 1, wherein the cleanup device further comprises a casing, a bottom of the casing is open, and a side, facing towards the reflector plate, of the casing is at least partially open, and the cleaning device and the moving device are arranged in the casing.

14. The cleaning system for the semiconductor storage shelf according to claim 1, wherein the first gear transmission assembly comprises a first bevel gear connected to the first cleaning motor, a second bevel gear connected to the first cleaning portion, and a third bevel gear connected to the plurality of cleaning brushes.

* * * * *